(12) United States Patent
Ota et al.

(10) Patent No.: US 10,629,687 B2
(45) Date of Patent: Apr. 21, 2020

(54) SILICON CARBIDE SEMICONDUCTOR DEVICE

(71) Applicant: KABUSHIKI KAISHA TOSHIBA, Minato-ku (JP)

(72) Inventors: Chiharu Ota, Kawasaki (JP);
Tatsunori Sakano, Shinagawa (JP);
Tatsuo Shimizu, Shinagawa (JP);
Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 65 days.

(21) Appl. No.: 16/100,272

(22) Filed: Aug. 10, 2018

(65) Prior Publication Data
US 2019/0273135 A1    Sep. 5, 2019

(30) Foreign Application Priority Data
Mar. 2, 2018  (JP) .................. 2018-037448

(51) Int. Cl.
| | | |
|---|---|---|
| H01L 29/16 | (2006.01) | |
| H01L 29/66 | (2006.01) | |
| H01L 21/02 | (2006.01) | |

(52) U.S. Cl.
CPC .... *H01L 29/1608* (2013.01); *H01L 21/02378* (2013.01); *H01L 29/66068* (2013.01)

(58) Field of Classification Search
CPC .............. H01L 29/1608; H01L 29/66068
See application file for complete search history.

(56) References Cited

U.S. PATENT DOCUMENTS

| | | | | |
|---|---|---|---|---|
| 7,732,821 B2 * | 6/2010 | Suzuki | ............... | H01L 21/0465 |
| | | | | 257/335 |
| 9,082,815 B2 * | 7/2015 | Sugimoto | ........... | H01L 29/7397 |

(Continued)

FOREIGN PATENT DOCUMENTS

| | | |
|---|---|---|
| JP | 2012-199522 | 10/2012 |
| JP | 5554042 | 7/2014 |

(Continued)

OTHER PUBLICATIONS

E.A. Imhoff, et al., "Positive Temperature Coefficient SiC PiN Diodes," Silicon Carbide and Related Materials 2011, Materials Science Forum vols. 717-720, 2012, pp. 981-984.

(Continued)

*Primary Examiner* — Ida M Soward
(74) *Attorney, Agent, or Firm* — Oblon, McClelland, Maier & Neustadt, L.L.P.

(57) ABSTRACT

According to one embodiment, a semiconductor device includes a first element. The first element includes a first electrode, a second electrode and first to fourth semiconductor regions. The second electrode includes a first conductive region and a second conductive region. The first semiconductor region is provided between the first electrode and the first conductive region and between the first electrode and the second conductive region. The second semiconductor region includes a first partial region and a second partial region. The first partial region is provided between the first electrode and the first conductive region. The second partial region is provided between the first electrode and the second conductive region. The third semiconductor region is provided between the second partial region and the second conductive region. The fourth semiconductor region is provided between the third semiconductor region and the second conductive region.

20 Claims, 7 Drawing Sheets

(56) References Cited

U.S. PATENT DOCUMENTS

| | | | |
|---|---|---|---|
| 9,184,230 B2* | 11/2015 | Harada | H01L 29/7802 |
| 9,324,787 B2* | 4/2016 | Ota | H01L 29/36 |
| 9,577,046 B1* | 2/2017 | Hori | H01L 29/1608 |
| 9,595,608 B2* | 3/2017 | Kumagai | H01L 29/0684 |
| 9,773,924 B2* | 9/2017 | Uchida | H01L 29/872 |
| 9,793,392 B2* | 10/2017 | Kinoshita | H01L 29/7397 |
| 9,978,843 B2* | 5/2018 | Takayanagi | H01L 29/1608 |
| 10,008,592 B1* | 6/2018 | Kojima | H01L 29/0615 |
| 10,236,372 B2* | 3/2019 | Okumura | H01L 21/02378 |
| 10,374,075 B2* | 8/2019 | Tominaga | H01L 29/1608 |
| 2006/0102908 A1* | 5/2006 | Imai | H01L 29/086 257/77 |
| 2007/0120145 A1* | 5/2007 | Asano | H01L 29/1016 257/115 |
| 2011/0101416 A1* | 5/2011 | Schulze | H01L 29/0834 257/139 |
| 2012/0228635 A1 | 9/2012 | Mizukami et al. | |
| 2015/0380494 A1 | 12/2015 | Furuhashi et al. | |
| 2017/0222046 A1* | 8/2017 | Wakimoto | H01L 21/26513 |
| 2017/0271456 A1* | 9/2017 | Ohse | H01L 29/66068 |
| 2017/0271528 A1* | 9/2017 | Oota | H01L 27/0814 |
| 2017/0373152 A1 | 12/2017 | Watanabe | |
| 2018/0076316 A1* | 3/2018 | Kinoshita | H01L 29/7813 |
| 2018/0158946 A1* | 6/2018 | Koga | H01L 29/7393 |
| 2018/0374948 A1* | 12/2018 | Naito | H01L 29/0696 |
| 2019/0013383 A1* | 1/2019 | Tang | H01L 21/04 |

FOREIGN PATENT DOCUMENTS

| | | |
|---|---|---|
| JP | 5955452 | 7/2016 |
| JP | 6012904 | 10/2016 |
| WO | WO 02/099869 A1 | 12/2002 |

OTHER PUBLICATIONS

Heinrich Schlangenotto, et al., "Improved Recovery of Fast Power Diodes with Self-Adjusting p Emitter Efficiency," IEEE Electron Device Letters, vol. 10, No. 7, Jul. 1989, pp. 322-324.

Thomas Basler, et al., "Switching ruggedness and surge-current capability of diodes using the self-adjusting p emitter efficiency diode concept," IET Circuits Devices Syst., 2014, vol. 8, Iss. 3, pp. 205-212.

* cited by examiner

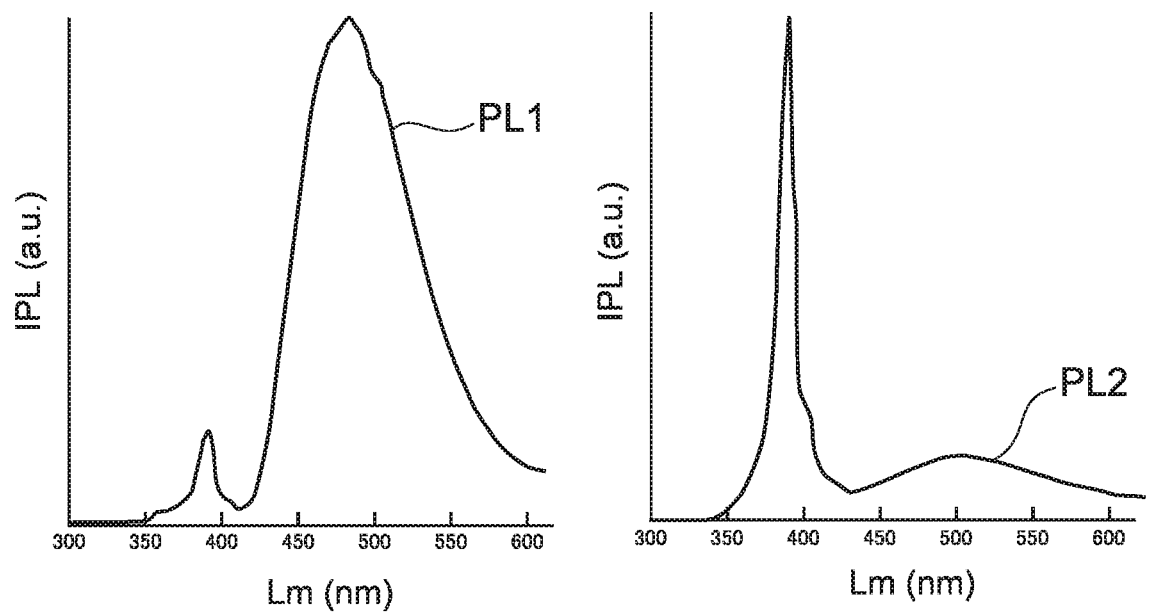
FIG. 8A
FIG. 8B
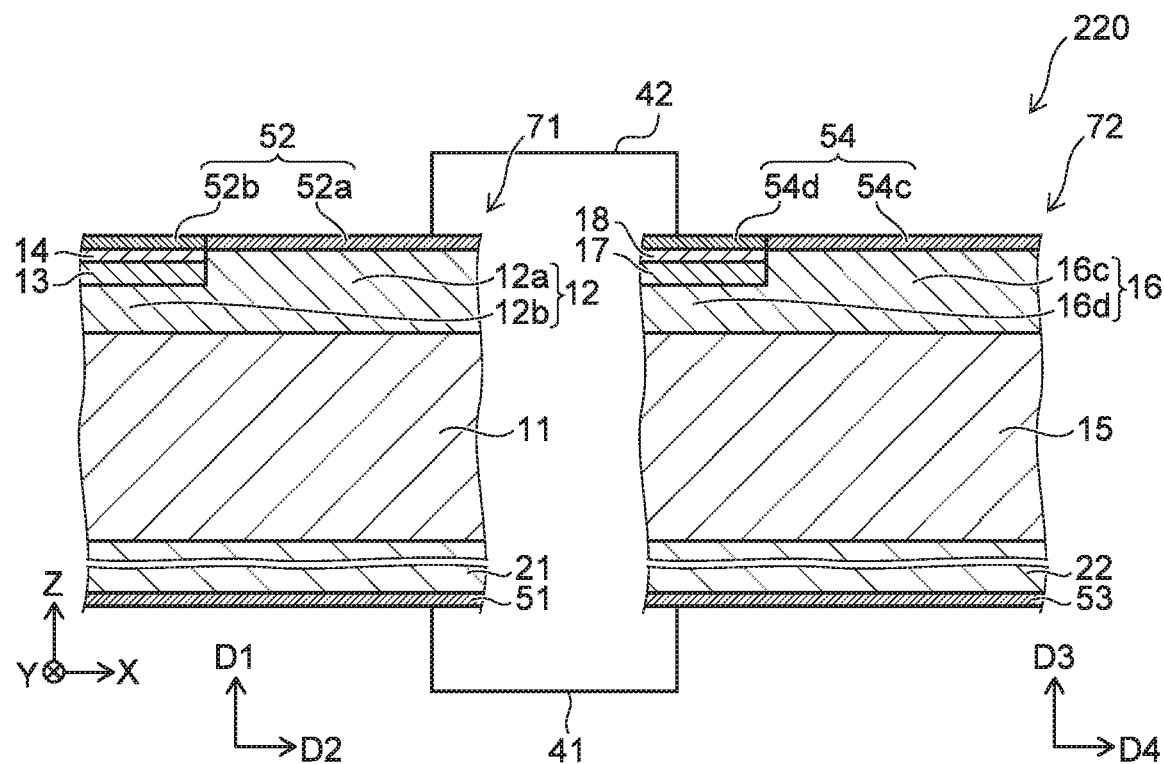
FIG. 9

SILICON CARBIDE SEMICONDUCTOR DEVICE

CROSS-REFERENCE TO RELATED APPLICATIONS

This application is based upon and claims the benefit of priority from Japanese Patent Application No. 2018-037448, filed on Mar. 2, 2018; the entire contents of which are incorporated herein by reference.

FIELD

Embodiments described herein relate generally to a semiconductor device.

BACKGROUND

The operation of a semiconductor device may become unstable when using if the temperature coefficient in the temperature range of use is inappropriate.

BRIEF DESCRIPTION OF THE DRAWINGS

FIG. 8A and FIG. 8B are graphs illustrating characteristics of the semiconductor device; and FIG. 9 is a schematic cross-sectional view illustrating a semiconductor device according to the second embodiment.

DETAILED DESCRIPTION

Figure 1A:
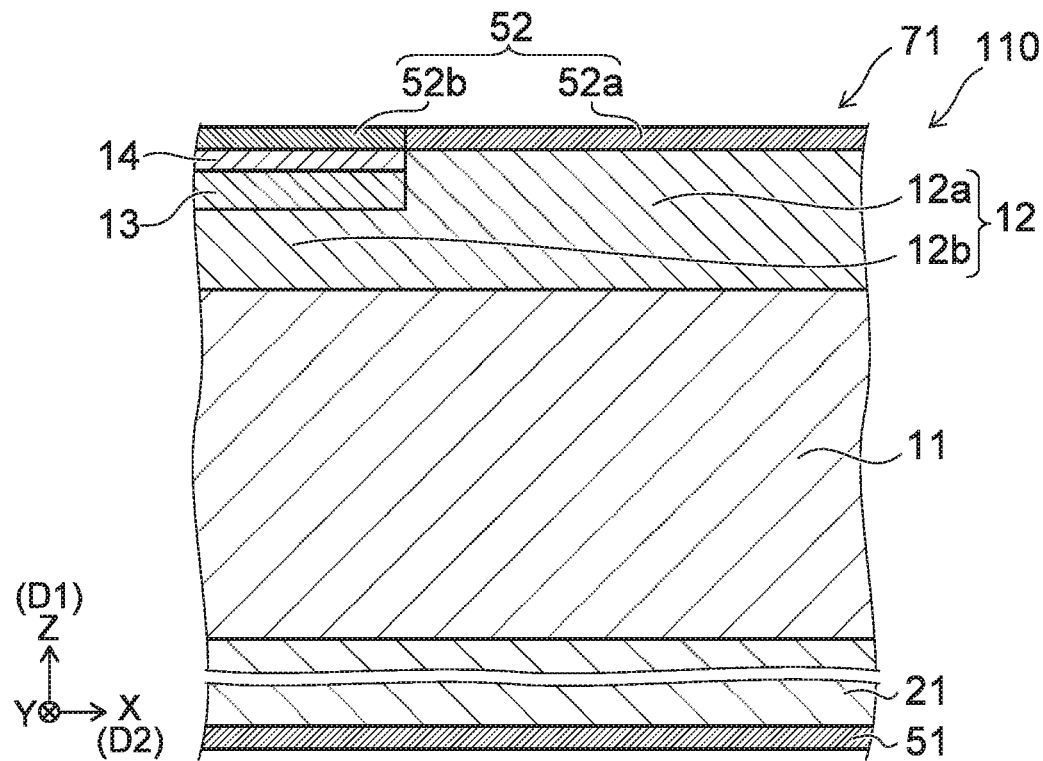
FIG. 1A and FIG. 1B are schematic cross-sectional views illustrating a semiconductor device according to a first embodiment.

According to one embodiment, a semiconductor device includes a first element. The first element includes a first electrode, a second electrode and first to fourth semiconductor regions. A direction from the first electrode toward the second electrode is aligned with a first direction. The second electrode includes a first conductive region and a second conductive region. A second direction from the second conductive region toward the first conductive region crosses the first direction. The first semiconductor region includes silicon carbide of a first conductivity type and is provided between the first electrode and the first conductive region and between the first electrode and the second conductive region. The second semiconductor region includes silicon carbide of a second conductivity type. The second semiconductor region includes a first partial region and a second partial region. The first partial region is provided between the first electrode and the first conductive region. The second partial region is provided between the first electrode and the second conductive region. The third semiconductor region includes silicon carbide of the second conductivity type and is provided between the second partial region and the second conductive region. The fourth semiconductor region includes silicon carbide of the second conductivity type and is provided between the third semiconductor region and the second conductive region.

The first element has a first state or a second state.

In the first state, the second to fourth semiconductor regions do not include an impurity of the first conductivity type. A concentration of an impurity of the second conductivity type in the fourth semiconductor region is higher than a concentration of the impurity of the second conductivity type in the second semiconductor region and not more than ½ of a concentration of the impurity of the second conductivity type in the third semiconductor region.

In the second state, the second to fourth semiconductor regions include an impurity of the first conductivity type and an impurity of the second conductivity type. A first difference between a concentration of the impurity of the second conductivity type in the fourth semiconductor region and a concentration of the impurity of the first conductivity type in the fourth semiconductor region is larger than a difference between a concentration of the impurity of the second conductivity type in the second semiconductor region and a concentration of the impurity of the first conductivity type in the second semiconductor region. The first difference is not more than ½ of a difference between a concentration of the impurity of the second conductivity type in the third semiconductor region and a concentration of the impurity of the first conductivity type in the third semiconductor region.

According to another embodiment, a semiconductor device includes a first element. The first element includes a first electrode, a second electrode and first to fourth semiconductor regions. A direction from the first electrode toward the second electrode is aligned with a first direction. The second electrode includes a first conductive region and a second conductive region. A second direction from the second conductive region toward the first conductive region crosses the first direction. The first semiconductor region includes silicon carbide of a first conductivity type and is provided between the first electrode and the first conductive region and between the first electrode and the second conductive region. The second semiconductor region includes silicon carbide of a second conductivity type. The second semiconductor region includes a first partial region and a second partial region. The first partial region is provided between the first electrode and the first conductive region. The second partial region is provided between the first electrode and the second conductive region. The third semiconductor region includes silicon carbide of the second conductivity type and is provided between the second partial region and the second conductive region. The fourth semiconductor region includes silicon carbide of the second conductivity type and is provided between the third semiconductor region and the second conductive region. The fourth semiconductor region includes at least one first element selected from the group consisting of Ar, Kr, Xe, Rn, N, P, Ti, and V. The first partial region does not include the first element, or a concentration of the first element in the first partial region is lower than a concentration of the first element in the fourth semiconductor region.

According to another embodiment, a semiconductor device includes a first element. The first element includes a first electrode, a second electrode and first to fourth semiconductor regions. A direction from the first electrode toward the second electrode is aligned with a first direction. The second electrode includes a first conductive region and a second conductive region. A second direction from the second conductive region toward the first conductive region crosses the first direction. The first semiconductor region includes silicon carbide of a first conductivity type and is provided between the first electrode and the first conductive region and between the first electrode and the second conductive region. The second semiconductor region includes silicon carbide of a second conductivity type. The second semiconductor region includes a first partial region and a second partial region. The first partial region is provided between the first electrode and the first conductive region. The second partial region is provided between the first electrode and the second conductive region. The third semiconductor region includes silicon carbide of the second conductivity type and is provided between the second partial region and the second conductive region. The fourth semiconductor region includes silicon carbide of the second conductivity type and is provided between the third semiconductor region and the second conductive region. A concentration of an impurity of the second conductivity type in the fourth semiconductor region is higher than a concentration of the impurity of the second conductivity type in the second semiconductor region and lower than a concentration of the impurity of the second conductivity type in the third semiconductor region, or the fourth semiconductor region includes at least one first element selected from the group consisting of Ar, Kr, Xe, Rn, N, P, Ti, and V. A first forward voltage at a first temperature for a first current density is not less than a second forward voltage at a second temperature for the first current density. The first current density is within a range of use. The second temperature is higher than the first temperature. A third forward voltage at the first temperature for a second current density is not more than a fourth forward voltage at the second temperature for the second current density, the second current density is within the range of use and higher than the first current density.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
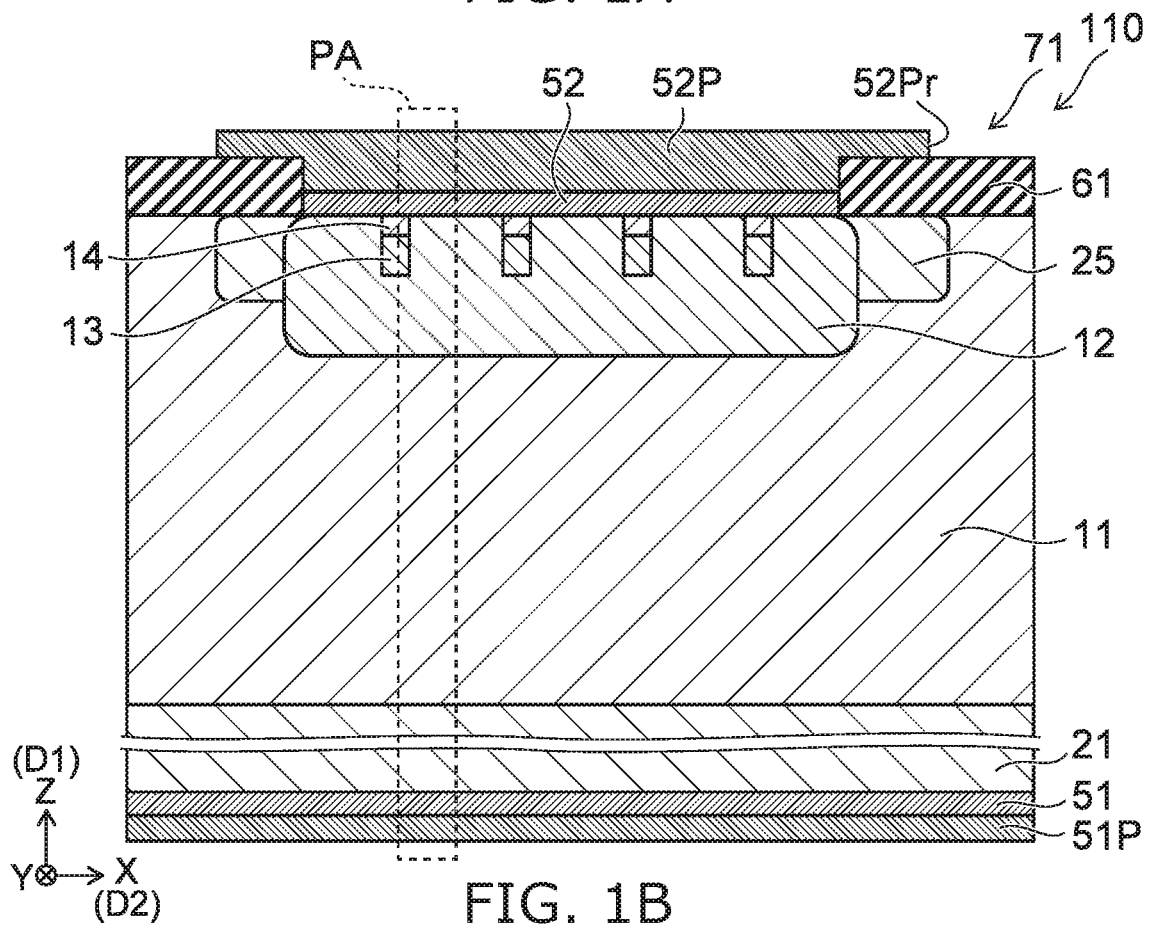

FIG. 1A and FIG. 1B are schematic cross-sectional views illustrating a semiconductor device according to a first embodiment.

FIG. 1A shows portion PA of FIG. 1B. As shown in FIG. 1A and FIG. 1B, the semiconductor device 110 according to the embodiment includes a first element 71. The first element 71 includes a first electrode 51, a second electrode 52, a first semiconductor region 11, a second semiconductor region 12, a third semiconductor region 13, and a fourth semiconductor region 14.

The direction from the first electrode 51 toward the second electrode 52 is aligned with a first direction D1. The second electrode 52 includes a first conductive region 52a and a second conductive region 52b. A second direction D2 from the second conductive region 52b toward the first conductive region 52a crosses the first direction D1.

The first direction D1 is taken as a Z-axis direction. One direction perpendicular to the Z-axis direction is taken as an X-axis direction. A direction perpendicular to the Z-axis direction and the X-axis direction is taken as a Y-axis direction.

The second direction D2 is, for example, the X-axis direction.

The first semiconductor region 11 is provided between the first electrode 51 and the first conductive region 52a and between the first electrode 51 and the second conductive region 52b. The first semiconductor region 11 includes silicon carbide (SiC) of a first conductivity type.

The second semiconductor region 12 includes silicon carbide of a second conductivity type.

For example, the first conductivity type is an n-type. In such a case, the second conductivity type is a p-type. In the embodiment, the first conductivity type may be the p-type; and the second conductivity type may be the n-type. Hereinbelow, the first conductivity type is taken to be the n-type; and the second conductivity type is taken to be the p-type. The description recited below is applicable even in the case where the first conductivity type is the p-type and the second conductivity type is the n-type.

The second semiconductor region 12 includes a first partial region 12a and a second partial region 12b. The first partial region 12a is provided between the first electrode 51 and the first conductive region 52a. The second partial region 12b is provided between the first electrode 51 and the second conductive region 52b.

The third semiconductor region 13 is provided between the second partial region 12b and the second conductive region 52b. The third semiconductor region 13 includes silicon carbide of the second conductivity type.

The fourth semiconductor region 14 is provided between the third semiconductor region 13 and the second conductive region 52b. The fourth semiconductor region 14 includes silicon carbide of the second conductivity type.

The impurity of the first conductivity type includes, for example, at least one selected from the group consisting of N and P. The impurity of the second conductivity type includes, for example, at least one selected from the group consisting of Al and B.

The concentration of the impurity of the second conductivity type in the fourth semiconductor region 14 is higher than the concentration of the impurity of the second conductivity type in the second semiconductor region 12. The concentration of the impurity of the second conductivity type in the fourth semiconductor region 14 is lower than the concentration of the impurity of the second conductivity type in the third semiconductor region 13.

The semiconductor device 110 is, for example, a diode. A first semiconductor portion 21 is further provided in the example. The first semiconductor portion 21 is provided between the first electrode 51 and the first semiconductor region 11. The first semiconductor portion 21 is of the first conductivity type. The concentration of the impurity of the first conductivity type in the first semiconductor portion 21 is higher than the concentration of the impurity of the first conductivity type in the first semiconductor region 11.

The first semiconductor portion 21 is, for example, an n$^+$-substrate (SiC) substrate. The first semiconductor region 11 is, for example, an n$^-$-epitaxial layer. The second semiconductor region 12 is, for example, a p$^-$-region. The third semiconductor region 13 is, for example, a p$^+$-region. The fourth semiconductor region 14 is, for example, a p region.

As shown in FIG. 1B, a first pad electrode 51P and a second pad electrode 52P are provided in the example. The first electrode 51 is provided between the first pad electrode 51P and the second pad electrode 52P. The first semiconductor region 11 is provided between the first electrode 51 and the second pad electrode 52P. The second semiconductor region 12 is provided between the first semiconductor region 11 and the second pad electrode 52P. The second electrode 52 is provided between the second semiconductor region 12 and the second pad electrode 52P.

A terminal structure 25 and an insulating film 61 are provided in the example. In the Z-axis direction, the insulating film 61 is provided between the first semiconductor region 11 and an outer edge portion 52Pr of the second pad electrode 52P. In the Z-axis direction, the terminal structure 25 is provided between the insulating film 61 and the first semiconductor region 11. For example, the depths of the terminal structure 25 and the second semiconductor region 12 each may be adjusted by considering the electric field concentration when applying a reverse voltage.

For example, the second electrode 52 includes two regions. The contact resistance between the semiconductor and the first conductive region 52a is higher than the contact resistance between the semiconductor and the second conductive region 52b. For example, the first conductive region 52a has a Schottky contact (a junction) with the semiconductor. The second conductive region 52b has substantially ohmic contact (a junction) with the semiconductor.

For example, the first conductive region 52a has a Schottky contact with the second semiconductor region 12 (e.g., the p$^-$-region). The second conductive region 52b has substantially ohmic contact with the fourth semiconductor region 14 (e.g., the p region).

For example, there is a reference example in which the fourth semiconductor region 14 is not provided. In the reference example, the second conductive region 52b has an ohmic contact with the third semiconductor region 13 (e.g., the p$^+$-region). The second conductive region 52b has an ohmic contact and a low resistance with the third semiconductor region 13. The temperature coefficient is negative in the reference example. For example, thermal runaway occurs when the temperature increases when operating.

In the embodiment, the fourth semiconductor region 14 is provided between the third semiconductor region 13 and the second conductive region 52b. As described above, the concentration of the impurity of the second conductivity type in the fourth semiconductor region 14 is lower than the concentration of the impurity of the second conductivity type in the third semiconductor region 13. Therefore, the contact resistance between the second conductive region 52b and the fourth semiconductor region 14 is higher than that of the reference example recited above. A positive temperature coefficient is obtained in the embodiment.

In the embodiment, for example, the hole current is suppressed by the existence of the fourth semiconductor region 14. Thereby, the contribution of the electron current becomes large. For example, the temperature characteristic at a high temperature in the practical rated current density range is 0 or positive with respect to room temperature. For example, the thermal runaway when operating can be suppressed. A semiconductor device can be provided in which stable operations are possible.

In the embodiment, an excessively low contact resistance at the portion of the second conductive region 52b is suppressed. Thereby, the temperature coefficient in the current density range of use can be 0 or positive.

In the embodiment, for example, the concentration of the impurity of the second conductivity type in the fourth semiconductor region 14 is not more than ½ of the concentration of the impurity of the second conductivity type in the third semiconductor region 13. Thereby, the temperature coefficient in the current density range of use can be 0 or positive.

To simplify the description in the description recited above, an example is described in which the second to fourth semiconductor regions 12 to 14 do not include an impurity of the first conductivity type. The second to fourth semiconductor regions 12 to 14 may include the impurity of the second conductivity type and the impurity of the first conductivity type. For example, the first element 71 may have a first state or a second state described below.

In the first state, the second to fourth semiconductor regions 12 to 14 substantially do not include the impurity of the first conductivity type. The second to fourth semiconductor regions 12 to 14 include the impurity of the second conductivity type. The concentration of the impurity of the second conductivity type in the fourth semiconductor region 14 is higher than the concentration of the impurity of the second conductivity type in the second semiconductor region 12. The concentration of the impurity of the second conductivity type in the fourth semiconductor region 14 is lower than the concentration of the impurity of the second conductivity type in the third semiconductor region 13. The concentration of the impurity of the second conductivity type in the fourth semiconductor region 14 is, for example, not more than ½ of the concentration of the impurity of the second conductivity type in the third semiconductor region 13.

In the second state, the second to fourth semiconductor regions 12 to 14 include the impurity of the first conductivity type and the impurity of the second conductivity type. The difference between the concentration of the impurity of the second conductivity type in the fourth semiconductor region 14 and the concentration of the impurity of the first conductivity type in the fourth semiconductor region 14 is taken as a first difference. The first difference is larger than the difference between the concentration of the impurity of the second conductivity type in the second semiconductor region 12 and the concentration of the impurity of the first conductivity type in the second semiconductor region 12. The first difference is smaller than the difference between the concentration of the impurity of the second conductivity type in the third semiconductor region 13 and the concentration of the impurity of the first conductivity type in the third semiconductor region 13. The first difference is, for example, not more than ½ of the difference between the concentration of the impurity of the second conductivity type in the third semiconductor region 13 and the concentration of the impurity of the first conductivity type in the third semiconductor region 13.

In the embodiment, for example, the concentration of the impurity of the second conductivity type in the fourth semiconductor region 14 is not less than 5 times the concentration of the impurity of the second conductivity type in the second semiconductor region 12 (e.g., at least one of the first partial region 12a or the second partial region 12b).

An example of profiles of the impurities in the semiconductor regions will now be described.

Figure 2A:
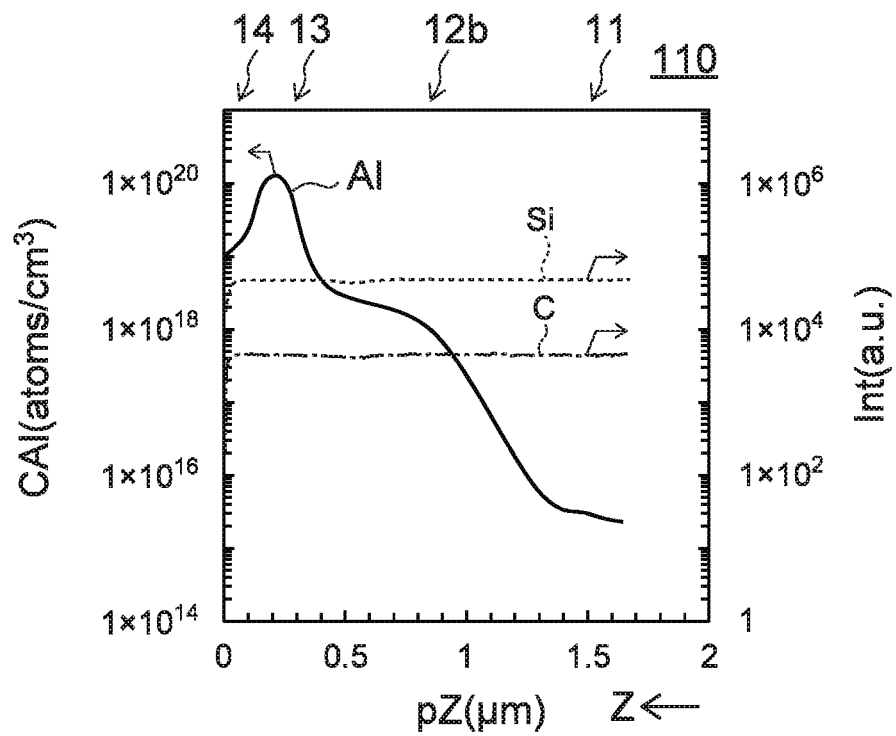
FIG. 2A and FIG. 2B are schematic views illustrating semiconductor devices.
Figure 2B:
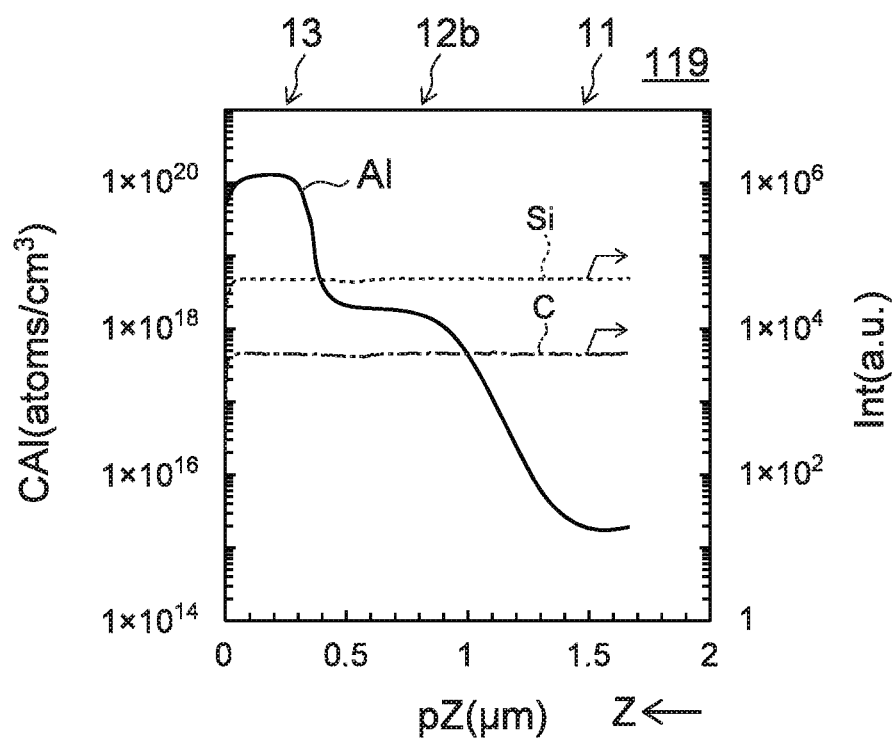

FIG. 2A and FIG. 2B are schematic views illustrating semiconductor devices.

FIG. 2A corresponds to the semiconductor device 110 according to the embodiment. FIG. 2B corresponds to a semiconductor device 119 of the reference example. The fourth semiconductor region 14 is not provided in the semiconductor device 119. The third semiconductor region 13 contacts the second conductive region 52b in the semiconductor device 119.

These figures illustrate profiles (SIMS analysis results) of the impurities of the semiconductor devices. These figures illustrate the change of the concentrations of the impurities along a direction passing through the first semiconductor region 11, the second partial region 12b, the third semiconductor region 13, and the fourth semiconductor region 14. In these figures, the horizontal axis is a position pZ (μm) in the depth direction (the Z-axis direction). The vertical axis on the left is a concentration CAl (atoms/cm$^3$) of the impurity (Al). The vertical axis on the right is a signal strength Int (arbitrary units) corresponding to Si and C.

As shown in FIG. 2B, in the semiconductor device 119 of the reference example, the concentration CAl is high in the range where the position pZ is 0 μm to 0.3 μm. This portion corresponds to the third semiconductor region 13. The concentration CAl (a first concentration) in the range (the interface vicinity) where the position pZ is 0 μm to 0.1 μm is slightly lower than the peak concentration (a second concentration) of Al in the third semiconductor region 13. It is considered that the reason that the first concentration is lower than the second concentration is because the analysis precision of the SIMS measurement is not high in the transition region. In the semiconductor device 119, the first concentration is greater than ½ of the second concentration. In the case of such a first concentration, the contact resistance with the second conductive region 52b undesirably is excessively low. Therefore, it is difficult to set the temperature coefficient in the current density range of use to be 0 or positive.

Conversely, in the semiconductor device 110 according to the embodiment as shown in FIG. 2A, the concentration CAl (the first concentration) in the range (the interface vicinity) where the position pZ is 0 μm to 0.1 μm is markedly lower than the peak concentration (the second concentration) of Al in the third semiconductor region 13. The first concentration is ½ of the second concentration or less. In the example, the first concentration is 1/10 of the second concentration or less. For such a first concentration, an excessively low contact resistance with the second conductive region 52b can be suppressed. Thereby, the temperature coefficient in the current density range of use can be set to 0 or positive.

In the embodiment, the first concentration may be not less than 0.1 times and not more than 0.4 times the second concentration.

In the embodiment, the carrier concentration of the second conductivity type in the second semiconductor region 12 (the first partial region 12a and the second partial region 12b) is, for example, not less than $5 \times 10^{17}$ cm$^{-3}$ but less than $5 \times 10^{18}$ cm$^{-3}$.

The carrier concentration of the second conductivity type in the third semiconductor region 13 is, for example, not less than $5 \times 10^{19}$ cm$^{-3}$ and not more than $1 \times 10^{21}$ cm$^{-3}$.

The carrier concentration of the second conductivity type in the fourth semiconductor region 14 is, for example, not less than $5 \times 10^{18}$ cm$^{-3}$ and not more than $5 \times 10^{20}$ cm$^{-3}$.

The carrier concentration of the first conductivity type in the first semiconductor region 11 is, for example, not less than $1 \times 10^{14}$ cm$^{-3}$ and not more than $2 \times 10^{16}$ cm$^{-3}$.

The thickness (the length along the first direction D1) of the second partial region 12b is, for example, not less than 300 nanometers and not more than 1000 nanometers.

The thickness (the length along the first direction D1) of the third semiconductor region 13 is, for example, not less than 50 nanometers and not more than 1000 nanometers.

The thickness (the length along the first direction D1) of the fourth semiconductor region 14 is, for example, not less than 20 nanometers and not more than 500 nanometers.

As described above, the contact resistance between the semiconductor and the first conductive region 52a is higher than the contact resistance between the semiconductor and the second conductive region 52b. For example, the state of a compound (e.g., a silicide) may be different between these regions. For example, the first conductive region 52a and the second conductive region include a metallic element. For example, the region including the boundary between the fourth semiconductor region 14 and the second conductive region 52b includes a bond between silicon and the metallic element. On the other hand, the region including the boundary between the first partial region 12a and the first conductive region 52a does not include the bond recited above (the bond between silicon and the metallic element recited above). Or, the concentration of the bond recited above (the bond between silicon and the metallic element recited above) in the region including the boundary between the first partial region 12a and the first conductive region 52a is lower than the concentration of the bond recited above in the region including the boundary between the fourth semiconductor region 14 and the second conductive region 52b. For example, the state of the compound (e.g., the silicide) may be controlled by performing surface treatment of one of the first partial region 12a or the fourth semiconductor region 14.

For example, the first conductive region 52a and the second conductive region 52b may include mutually-different metallic elements. For example, the first conductive region 52a includes a first metallic element. The second conductive region 52b includes a second metallic element. The metallic element is, for example, Ti. The second metallic element is, for example, Ni. For example, the first conductive region 52a includes Ti. The second conductive region 52b includes Ni and Si. For example, the contact resistance between the semiconductor and the first conductive region 52a can be higher than the contact resistance between the semiconductor and the second conductive region 52b.

For example, the work function of the first metallic element may be lower than the work function of the second metallic element. The work function of the first metallic element is, for example, not less than about 4.2 eV and not more than about 4.8 eV. The work function of the second metallic element is, for example, not less than about 5.04 eV and not more than about 5.35 eV.

For example, the first conductive region 52a includes at least one selected from the group consisting of Ti, Mo, W, Pt, Ni, and Al. On the other hand, for example, the second conductive region 52b includes at least one selected from the group consisting of Ni, Ti, and Al. For example, the contact resistance between the semiconductor and the first conductive region 52a can be higher than the contact resistance between the semiconductor and the second conductive region 52b.

For example, the contact resistance between the fourth semiconductor region 14 and the second conductive region 52b is not less than $1 \times 10^{-3}$ Ωcm$^2$ and not more than $5 \times 10^{-3}$ $\Omega cm^2$. The contact resistance between the first partial region 12a and the first conductive region 52a may not be measureable.

In the embodiment as shown in FIG. 1A, the direction from the third semiconductor region 13 toward a portion of the first partial region 12a is aligned with the second direction D2. The direction from the fourth semiconductor region 14 toward another portion of the first partial region 12a is aligned with the second direction D2.

As shown in FIG. 1A, the length (the width) along the second direction D2 of the third semiconductor region 13 is shorter than the length (the width) along the second direction D2 of the first partial region 12a. The length (the width) along the second direction D2 of the fourth semiconductor region 14 is shorter than the length (the width) along the second direction D2 of the first partial region 12a. By such a length relationship, for example, the hole current can be suppressed; and the resistance can be increased when the temperature increases. For example, it is easy for the characteristics to be more stable for multiple use in parallel.

For example, it is favorable for the length (the width) along the second direction D2 of the third semiconductor region 13 to be not less than 0.2 times and not more than 0.95 times the length (the width) along the second direction D2 of the first partial region 12a. For example, it is favorable for the length (the width) along the second direction D2 of the fourth semiconductor region 14 to be not less than 0.2 times and not more than 0.95 times the length (the width) along the second direction D2 of the first partial region 12a.

An example of characteristics of the semiconductor device according to the embodiment will now be described.

Figure 3A:
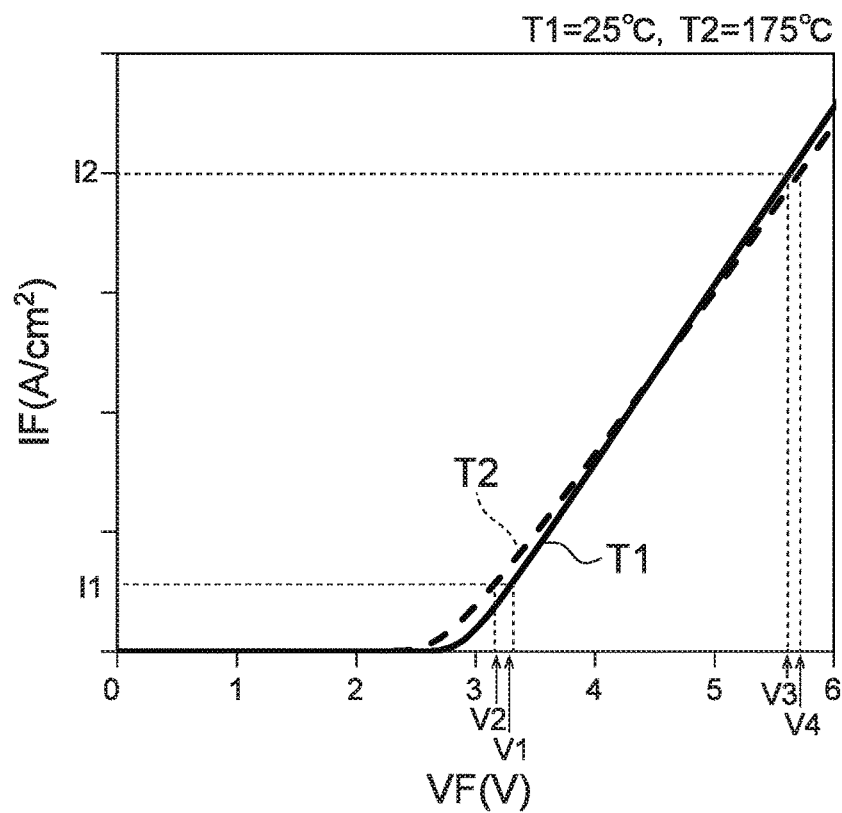
FIG. 3A and FIG. 3B are schematic views illustrating the characteristics of the semiconductor device according to the first embodiment.
Figure 3B:
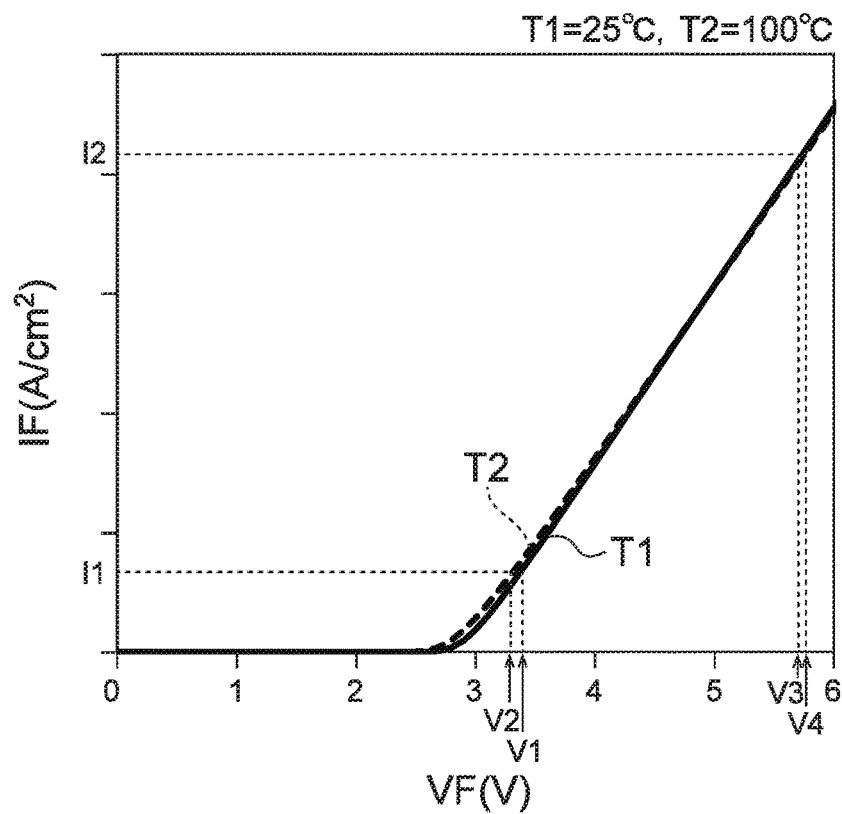

FIG. 3A and FIG. 3B are schematic views illustrating the characteristics of the semiconductor device according to the first embodiment.

These figures show examples of the relationships between a current density IF and a forward voltage VF of the semiconductor device. In these figures, the horizontal axis is the forward voltage VF (V). The vertical axis is the current density IF (A/cm$^2$). The characteristics at different temperatures (a first temperature T1 and a second temperature T2) are illustrated in these figures. In these figures, the first temperature T1 is 25° C. In FIG. 3A, the second temperature T2 is 175° C. In FIG. 3B, the second temperature T2 is 100° C. In these figures, the characteristics at the first temperature T1 are the same. In these figures, the range of the current density IF is the range of use (the range of the current density assumed when using the semiconductor device).

As shown in FIG. 3A and FIG. 3B, the slope of the characteristic for the second temperature T2 (the high temperature) is lower than the slope of the characteristic for the first temperature T1 (room temperature or a low temperature). The curve of the characteristic for the first temperature T1 and the curve of the characteristic for the second temperature T2 cross for current densities IF of the range of use.

For example, the forward voltage VF is taken to be a first forward voltage V1 at the first temperature T1 for a first current density I1 within the range of use. The forward voltage VF is taken to be a second forward voltage V2 at the second temperature T2 for the first current density I1. The second temperature T2 is higher than the first temperature T1. In the embodiment, the first forward voltage V1 is higher than the second forward voltage V2. The first forward voltage V1 may be the second forward voltage V2 or more.

The forward voltage VF is taken to be a third forward voltage V3 at the first temperature T1 for a second current density I2. The second current density I2 is within the range of use and is higher than the first current density I1. The forward voltage VF is taken to be a fourth forward voltage V4 at the second temperature T2 for the second current density I2. In the embodiment, the third forward voltage V3 is lower than the fourth forward voltage V4. The third forward voltage V3 may be not more than the fourth forward voltage V4.

Thus, in the embodiment, the temperature coefficient can be set to 0 or positive.

Compared to silicon, the breakdown electric field intensity is high for silicon carbide. Therefore, the drift layer (the first semiconductor region 11) can be set to be thin; and the carrier concentration can be set to be high. However, in such a case, generally, in a bipolar semiconductor device, the current density at a high temperature is higher than the current density at room temperature. Thereby, the forward voltage VF decreases. For example, the temperature coefficient becomes negative. On the other hand, in a bipolar semiconductor device that uses silicon, the drift layer is thick; therefore, the resistance component operates at high temperatures; and as a result, the temperature coefficient is positive in the current density range of use.

In the embodiment, in the bipolar semiconductor device based on silicon carbide, for example, the proportion of the electron current is set to be high by controlling the proportion of the electron current and the hole current. Thereby, the resistance increases at a high temperature. The hole current decreases relatively.

In the embodiment, for example, the injection amount of the holes is controlled by providing the second semiconductor region 12 (the first partial region 12a) recited above. The unipolar proportion is increased; and the bipolar proportion is reduced.

Thus, in the semiconductor device according to the embodiment, the temperature characteristic at a high temperature in the practical rated current density range is 0 or positive. For example, the thermal runaway when operating can be suppressed. A semiconductor device can be provided in which stable operations are possible.

An example of a method for manufacturing the semiconductor device according to the embodiment will now be described.

FIG. 4A to FIG. 4F are schematic cross-sectional views in order of the processes, illustrating the method for manufacturing the semiconductor device according to the first embodiment.

Figure 4A:
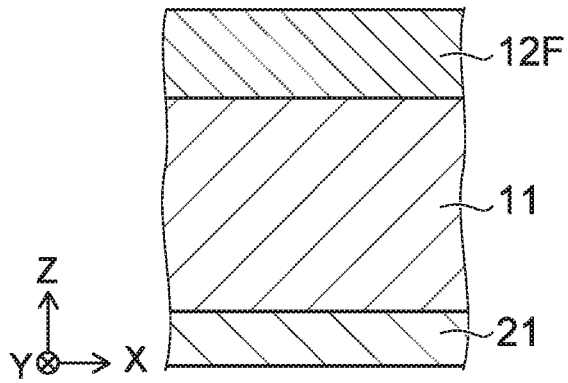
FIG. 4A to FIG. 4F are schematic cross-sectional views in order of the processes, illustrating the method for manufacturing the semiconductor device according to the first embodiment.

As shown in FIG. 4A, the first semiconductor region 11 is formed on the first semiconductor portion 21. For example, the first semiconductor region 11 is formed by epitaxial growth. A semiconductor film 12F that is used to form the second semiconductor region 12 is formed on the first semiconductor region 11. For example, the semiconductor film 12F is made by epitaxial growth or ion implantation.

Figure 4B:
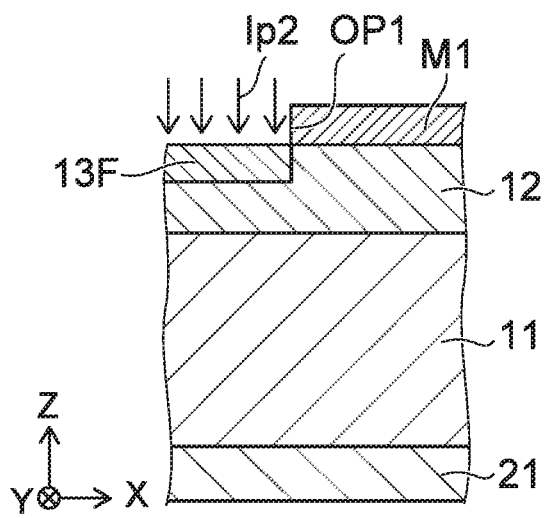

As shown in FIG. 4B, an impurity Ip2 of the second conductivity type is introduced to a portion of the semiconductor film 12F by using a mask M1 having an opening OP1. For example, ion implantation is performed. Thereby, the second semiconductor region 12 is formed.

Figure 4C:
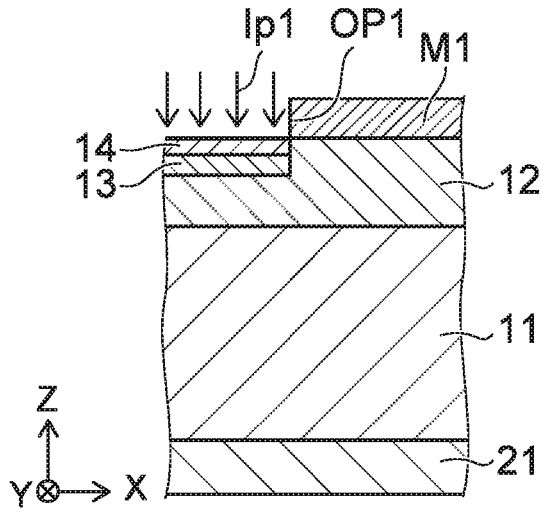

An impurity Ip1 of the first conductivity type is introduced as shown in FIG. 4C. Thereby, the third semiconductor region 13 and the fourth semiconductor region 14 are obtained. The mask M1 is removed.

Figure 4D:
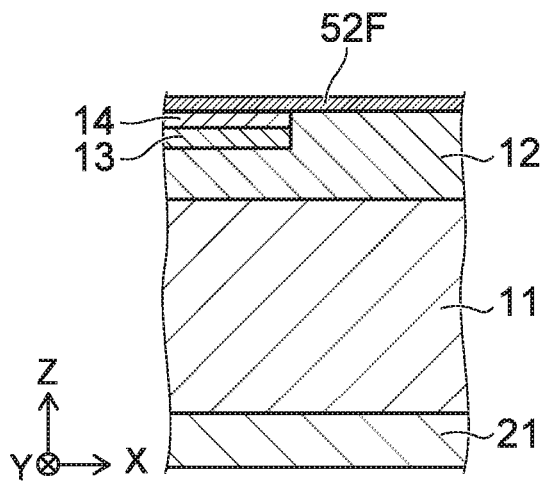

As shown in FIG. 4D, a metal film 52F is formed on the fourth semiconductor region 14 and the second semiconductor region 12.

Figure 4E:
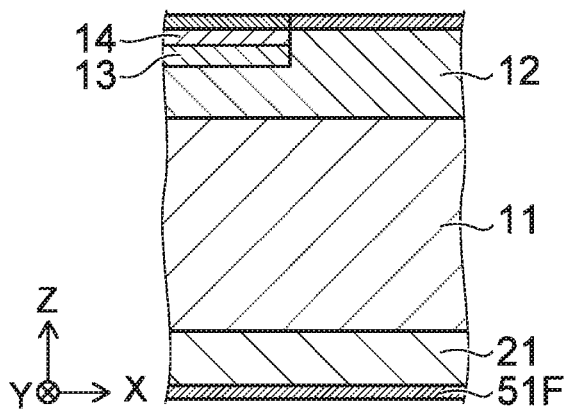

As shown in FIG. 4E, a metal film 51F that is used to form the first electrode 51 is formed on the back surface of the first semiconductor portion 21. Subsequently, heat treatment is performed.

Figure 4F:
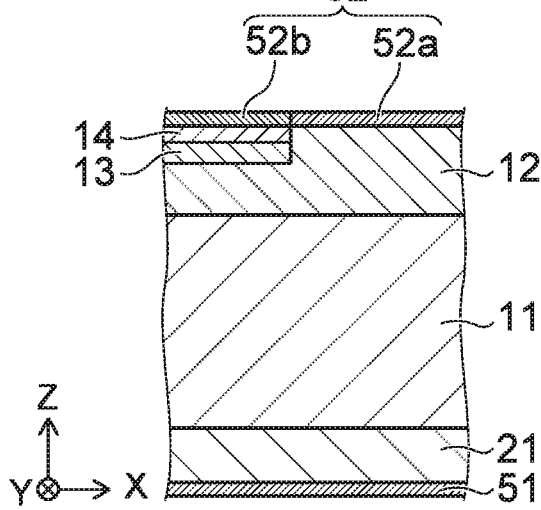

As shown in FIG. 4F, the first conductive region 52a and the second conductive region 52b are formed by the heat treatment due to the difference of the impurities between the second semiconductor region 12 and the fourth semiconductor region 14. The first electrode 51 is obtained by heat treatment. Thereby, the semiconductor device 110 is obtained.

The third semiconductor region 13 and the fourth semiconductor region 14 may be formed by modifying the conditions of the ion implantation in the process described in reference to FIG. 4B recited above. In such a case, the process described in reference to FIG. 4C is omitted.

FIG. 5A to FIG. 5E are schematic cross-sectional views in order of the processes, illustrating the method for manufacturing the semiconductor device according to the first embodiment.

Figure 5A:
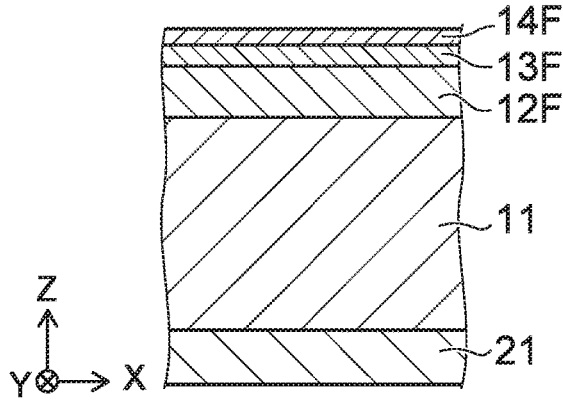
FIG. 5A to FIG. 5E are schematic cross-sectional views in order of the processes, illustrating the method for manufacturing the semiconductor device according to the first embodiment.

As shown in FIG. 5A, the first semiconductor region 11, the semiconductor film 12F that is used to form the second semiconductor region 12, the semiconductor film 13F that is used to form the third semiconductor region 13, and a semiconductor film 14F that is used to form the fourth semiconductor region 14 are formed in this order on the first semiconductor portion 21. For example, these semiconductor films are formed by epitaxial growth.

Figure 5B:
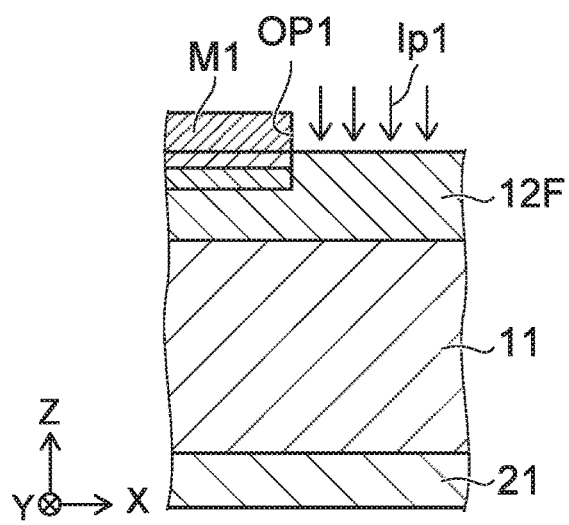

As shown in FIG. 5B, the impurity Ip1 of the first conductivity type is introduced to a portion of the semiconductor film 14F and a portion of the semiconductor film 13F by using the mask M1 having the opening OP1. For example, ion implantation is performed. Thereby, the second semiconductor region 12 is formed.

Figure 5C:
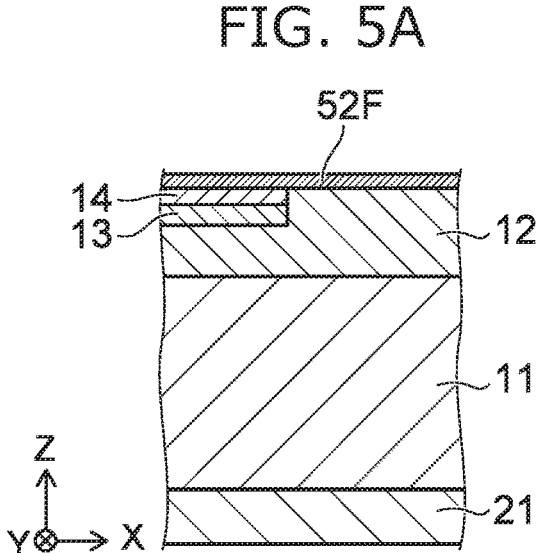
Figure 5D:
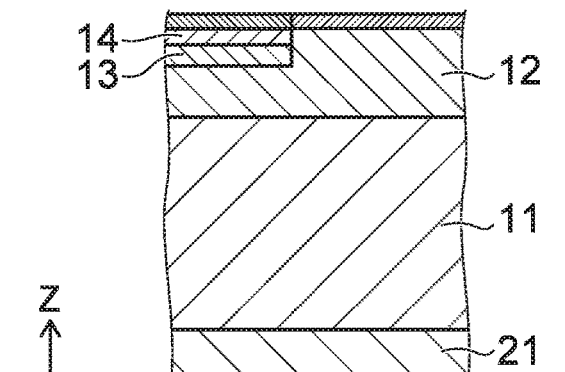
Figure 5E:
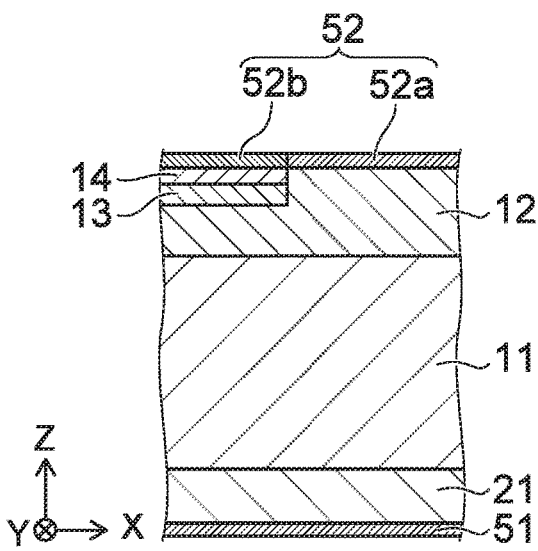

Subsequently, as shown in FIG. 5C to FIG. 5E, processing similar to the processes described in reference to FIG. 4C to FIG. 4E are performed. Thereby, the semiconductor device 110 is obtained.

Figure 6:
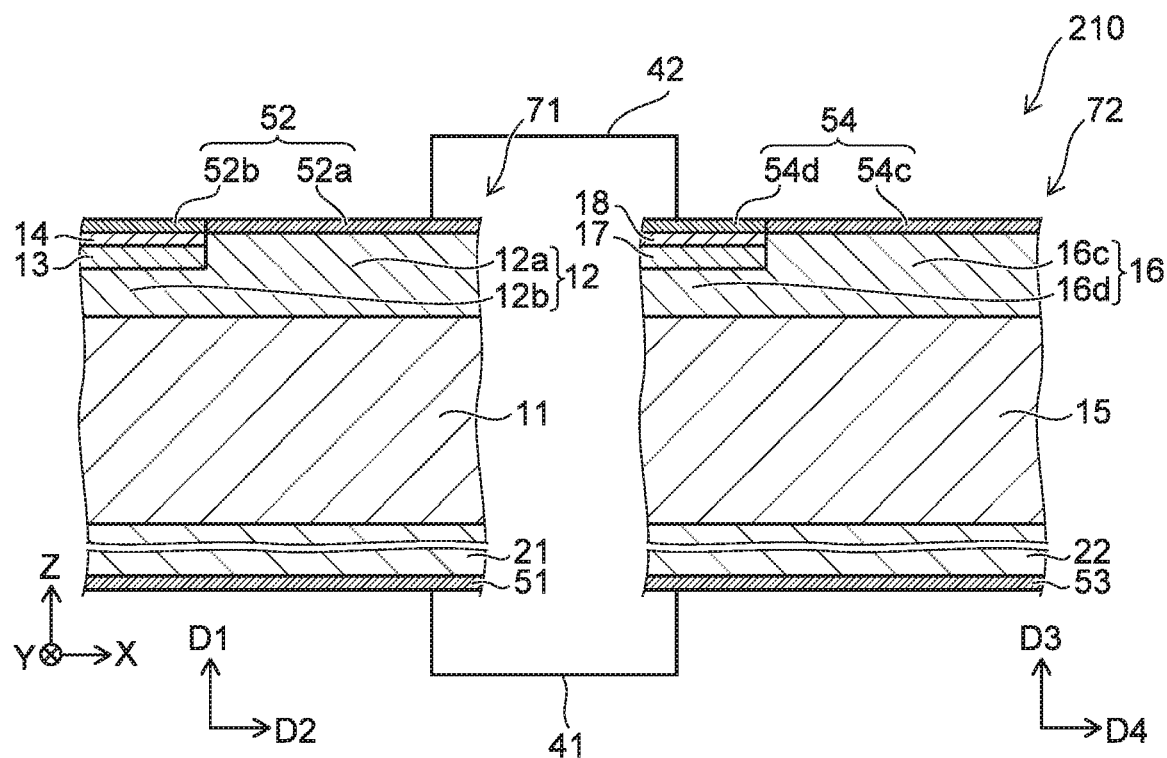
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, the semiconductor device 210 according to the embodiment further includes a second element 72, a first connection member 41, and a second connection member 42 in addition to the first element 71.

The second element 72 includes a third electrode 53, a fourth electrode 54, a fifth semiconductor region 15, a sixth semiconductor region 16, a seventh semiconductor region 17, and an eighth semiconductor region 18.

The direction from the third electrode 53 toward the fourth electrode 54 is aligned with a third direction D3. The fourth electrode 54 includes a third conductive region 54c and a fourth conductive region 54d. A fourth direction D4 from the fourth conductive region 54d toward the third conductive region 54c crosses the third direction D3.

For example, the fourth direction D4 may be perpendicular to the third direction D3. The third direction D3 may be aligned with the first direction D1 or may cross the first direction D1. The fourth direction D4 may be aligned with the second direction D2 or may cross the second direction D2.

The fifth semiconductor region 15 is provided between the third electrode 53 and the third conductive region 54c and between the third electrode 53 and the fourth conductive region 54d. The fifth semiconductor region 15 includes silicon carbide of the first conductivity type.

The sixth semiconductor region 16 includes silicon carbide of the second conductivity type. The sixth semiconductor region 16 includes a third partial region 16c and a fourth partial region 16d. The third partial region 16c is provided between the third electrode 53 and the third conductive region 54c. The fourth partial region 16d is provided between the third electrode 53 and the fourth conductive region 54d.

The seventh semiconductor region 17 is provided between the fourth partial region 16d and the fourth conductive region 54d. The seventh semiconductor region 17 includes silicon carbide of the second conductivity type.

The eighth semiconductor region 18 is provided between the seventh semiconductor region 17 and the fourth conductive region 54d. The eighth semiconductor region 18 includes silicon carbide of the second conductivity type.

The concentration of the impurity of the second conductivity type in the eighth semiconductor region 18 is higher than the concentration of the impurity of the second conductivity type in the sixth semiconductor region 16. The concentration of the impurity of the second conductivity type in the eighth semiconductor region 18 is lower than the concentration of the impurity of the second conductivity type in the seventh semiconductor region 17. For example, the concentration of the impurity of the second conductivity type in the eighth semiconductor region 18 may be not more than ½ of the concentration of the impurity of the second conductivity type in the seventh semiconductor region 17.

In the embodiment, for example, the concentration of the impurity of the second conductivity type in the eighth semiconductor region 18 is not less than 5 times the concentration of the impurity of the second conductivity type in the sixth semiconductor region 16 (e.g., at least one of the third partial region 16c or the fourth partial region 16d).

The first connection member 41 electrically connects the first electrode 51 and the third electrode 53 to each other. The second connection member 42 electrically connects the second electrode 52 and the fourth electrode 54 to each other. For example, the first element 71 and the second element 72 are connected in parallel.

The configurations of the first electrode 51 and the second electrode 52 of the first element 71 are applicable respectively to the third electrode 53 and the fourth electrode 54 of the second element 72. The configurations of the first to fourth semiconductor regions 11 to 14 of the first element 71 are applicable respectively to the fifth to eighth semiconductor regions 15 to 18 of the second element 72.

In the second element 72 as well, for example, a temperature coefficient that is 0 or positive is obtained.

The second element 72 may have a third state or a fourth state described below.

In the third state, the sixth to eighth semiconductor regions 16 to 18 substantially do not include the impurity of the first conductivity type. The concentration of the impurity of the second conductivity type in the eighth semiconductor region 18 is higher than the concentration of the impurity of the second conductivity type in the sixth semiconductor region 16. The concentration of the impurity of the second conductivity type in the eighth semiconductor region 18 is lower than the concentration of the impurity of the second conductivity type in the seventh semiconductor region 17. For example, the concentration of the impurity of the second conductivity type in the eighth semiconductor region 18 is not more than ½ of the concentration of the impurity of the second conductivity type in the seventh semiconductor region 17.

In the fourth state, the sixth to eighth semiconductor regions 16 to 18 include the impurity of the first conductivity type and the impurity of the second conductivity type. The difference between the concentration of the impurity of the second conductivity type in the eighth semiconductor region 18 and the concentration of the impurity of the first conductivity type in the eighth semiconductor region 18 is taken as a second difference. The second difference is larger than the difference between the concentration of the impurity of the second conductivity type in the sixth semiconductor region 16 and the concentration of the impurity of the first conductivity type in the sixth semiconductor region 16. The second difference is smaller than the difference between the concentration of the impurity of the second conductivity type in the seventh semiconductor region 17 and the concentration of the impurity of the first conductivity type in the seventh semiconductor region. The second difference is, for example, not more than ½ of the difference between the concentration of the impurity of the second conductivity type in the seventh semiconductor region 17 and the concentration of the impurity of the first conductivity type in the seventh semiconductor region 17.

For example, there is a reference example in which multiple elements having negative temperature coefficients are connected in parallel. In such a case, when the temperature of one element increases, the current concentrates and flows in that element; and the increase of the temperature accelerates. Therefore, thermal runaway occurs easily in the one element.

Conversely, in the case where the multiple elements connected in parallel have positive temperature coefficients, when the temperature of the one element increases, the current flows preferentially in the other elements. Therefore, the thermal runaway of the one element can be suppressed. The thermal runaway can be suppressed for the multiple elements as an entirety. The effects of the embodiment can be realized more for a configuration in which multiple elements are connected in parallel.

As shown in FIG. 6, the second element 72 further includes a second semiconductor portion 22 of the first conductivity type. The second semiconductor portion 22 is provided between the third electrode 53 and the fifth semiconductor region 15. For example, the concentration of the impurity of the first conductivity type in the second semiconductor portion 22 is higher than the concentration of the impurity of the first conductivity type in the fifth semiconductor region 15.

Second Embodiment

Figure 7:
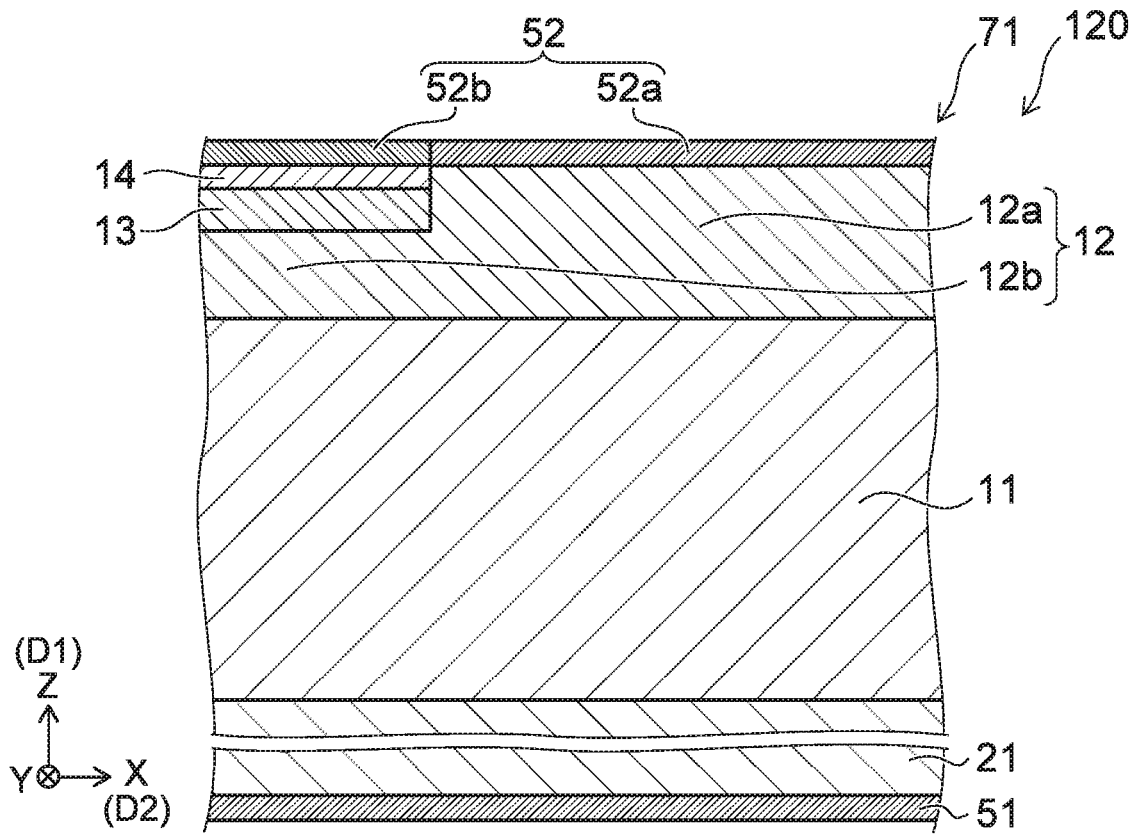
FIG. 7 is a schematic cross-sectional view illustrating a semiconductor device according to a second embodiment.

FIG. 7 is a schematic cross-sectional view illustrating a semiconductor device according to a second embodiment.

As shown in FIG. 7, the semiconductor device 120 according to the embodiment includes the first element 71. The first element 71 includes the first electrode 51, the second electrode 52, the first semiconductor region 11, the second semiconductor region 12, the third semiconductor region 13, and the fourth semiconductor region 14. The configuration of the fourth semiconductor region 14 of the semiconductor device 120 is different from the configuration of the fourth semiconductor region 14 of the semiconductor device 110. Otherwise, the configuration of the semiconductor device 120 is, for example, the same as the configuration of the semiconductor device 110. An example of the fourth semiconductor region 14 of the semiconductor device 120 will now be described.

In the semiconductor device 120 as well, the fourth semiconductor region 14 is provided between the third semiconductor region 13 and the second conductive region 52b. The fourth semiconductor region 14 includes silicon carbide of the second conductivity type. The fourth semiconductor region 14 includes at least one first element selected from the group consisting of Ar, Kr, Xe, Rn, N, P, Ti, and V.

The first partial region 12a does not include the first element. The concentration of the first element in the first partial region 12a is lower than the concentration of the first element in the fourth semiconductor region 14.

Because the fourth semiconductor region 14 includes the first element recited above, for example, the density of the crystal defects in the fourth semiconductor region 14 is higher than the density of the crystal defects in the first partial region 12a. For example, the mobility of the carriers in the fourth semiconductor region 14 becomes low. For example, the hole current is suppressed by the fourth semiconductor region 14. Thereby, the contribution of the electron current becomes large. For example, the temperature characteristic at a high temperature in the practical rated current density range is 0 or positive. For example, the thermal runaway when operating can be suppressed. A semiconductor device can be provided in which stable operations are possible.

The concentration of the first element in the fourth semiconductor region 14 is, for example, not less than $1 \times 10^{15}$ cm$^{-3}$ and not more than $1 \times 10^{19}$ cm$^{-3}$. When the concentration of the first element in the fourth semiconductor region 14 is less than $1 \times 10^{15}$ cm$^{-3}$, the effect of stabilizing the operations becomes insufficient. When the concentration of the first element in the fourth semiconductor region 14 exceeds $1 \times 10^{19}$ cm$^{-3}$, for example, the crystallinity degrades excessively; and, for example, there are cases where the characteristics (e.g., the on-resistance) of the semiconductor device degrade.

For example, the first partial region 12a and the first conductive region 52a have a Schottky contact. For example, the fourth semiconductor region 14 and the second conductive region 52b have an ohmic contact and a high resistance.

In the semiconductor device 120, for example, the density of the crystal defects in the fourth semiconductor region 14 is higher than the density of the crystal defects in the first partial region 12a. The difference between the densities of the crystal defects may be observed as the difference between the characteristics of the PL.

FIG. 8A and FIG. 8B are graphs illustrating characteristics of the semiconductor device.

These figures illustrate PL characteristics in the semiconductor regions. The horizontal axis is a wavelength Lm (nm (nanometers)). The vertical axis is an intensity IPL (arbitrary units). FIG. 8A corresponds to a first characteristic PL1 in a region of many crystal defects. FIG. 8B corresponds to a second characteristic PL2 in a region of few crystal defects. The region of few crystal defects is SiC that is epitaxially grown. The region of many crystal defects corresponds to a state after the first element is implanted into SiC that is epitaxially grown.

For the first characteristic PL1 as shown in FIG. 8A, the intensity IPL when the wavelength Lm is 500 nm is higher than the intensity IPL when the wavelength Lm is 390 nm.

For the second characteristic PL2 as shown in FIG. 8B, the intensity IPL when the wavelength Lm is 500 nm is lower than the intensity IPL when the wavelength Lm is 390 nm.

For example, the first characteristic PL1 is obtained in the fourth semiconductor region 14. For example, the second characteristic PL2 is obtained in the first partial region 12a.

For example, the ratio of the intensity at 500 nm for the photoluminescence of the fourth semiconductor region 14 to the intensity at 390 nm for the photoluminescence of the fourth semiconductor region 14 is higher than the ratio of the intensity at 500 nm for the photoluminescence of the first partial region 12a to the intensity at 390 nm for the photoluminescence of the first partial region 12a.

By providing such a fourth semiconductor region 14, for example, a semiconductor device can be provided in which it is possible to stabilize the characteristics.

FIG. 9 is a schematic cross-sectional view illustrating a semiconductor device according to the second embodiment.

As shown in FIG. 9, the semiconductor device 220 according to the embodiment further includes the second element 72, the first connection member 41, and the second connection member 42 in addition to the first element 71. The configuration of the eighth semiconductor region 18 in the second element 72 of the semiconductor device 220 is different from the configuration of the eighth semiconductor region 18 in the second element 72 of the semiconductor device 210. Otherwise, the configuration of the semiconductor device 220 is, for example, the same as the configuration of the semiconductor device 210.

In the second element 72 of the semiconductor device 220, the eighth semiconductor region 18 also includes silicon carbide of the second conductivity type. The eighth semiconductor region 18 includes at least one first element selected from the group consisting of Ar, Kr, Xe, Rn, N, P, Ti, and V. On the other hand, the third partial region 16c does not include the first element. The concentration of the first element in the third partial region 16c is lower than the concentration of the first element in the eighth semiconductor region 18.

In the embodiment as well, for example, a temperature coefficient that is 0 or positive is obtained in the second element 72. The effects of the embodiment can be realized more for a configuration in which multiple elements are connected in parallel. In the embodiment, the second element 72 illustrated in FIG. 9 may be the second element 72 described in reference to FIG. 6.

As shown in FIG. 9, in the semiconductor device 220 as well, the second element 72 may further include the second semiconductor portion 22.

Third Embodiment

In a semiconductor device according to the embodiment, the first element 71 also includes the first electrode 51, the second electrode 52, and the first to third semiconductor regions 11 to 13. These components are similar to those of the semiconductor device 110. The semiconductor device according to the embodiment also includes the fourth semiconductor region 14 (referring to FIGS. 1A and 1B, etc.). The concentration of the impurity of the second conductivity type in the fourth semiconductor region 14 is higher than the concentration of the impurity of the second conductivity type in the second semiconductor region. The concentration of the impurity of the second conductivity type in the fourth semiconductor region 14 is lower than the concentration of the impurity of the second conductivity type in the third semiconductor region 13. Or, the fourth semiconductor region 14 includes at least one first element selected from the group consisting of Ar, Kr, Xe, Rn, N, P, Ti, and V.

For example, the characteristics of the semiconductor device according to the embodiment are as described in reference to FIG. 3A and FIG. 3B. The first forward voltage V1 at the first temperature T1 for the first current density I1 that is within the range of use is not less than the second forward voltage V2 for the first current density I1 at the second temperature T2 that is higher than the first temperature T1. The third forward voltage V3 at the first temperature T1 for the second current density I2 that is within the range of use and higher than the first current density I1 is not more than the fourth forward voltage V4 at the second temperature T2 for the second current density I2. In the embodiment as well, it is possible to stabilize the operations.

According to the embodiments, a semiconductor device can be provided in which it is possible to stabilize the characteristics.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as elements, semiconductor regions, electrodes, connection members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising
a first element including
   a first electrode,
   a second electrode, a direction from the first electrode toward the second electrode being aligned with a first direction, the second electrode including a first conductive region and a second conductive region, a second direction from the second conductive region toward the first conductive region crossing the first direction,
- a first semiconductor region including silicon carbide of a first conductivity type and being provided between the first electrode and the first conductive region and between the first electrode and the second conductive region,
- a second semiconductor region including silicon carbide of a second conductivity type, the second semiconductor region including a first partial region and a second partial region, the first partial region being provided between the first electrode and the first conductive region, the second partial region being provided between the first electrode and the second conductive region,
- a third semiconductor region including silicon carbide of the second conductivity type and being provided between the second partial region and the second conductive region, and
- a fourth semiconductor region including silicon carbide of the second conductivity type and being provided between the third semiconductor region and the second conductive region, the first element having a first state or a second state,
in the first state, the second to fourth semiconductor regions not including an impurity of the first conductivity type, a concentration of an impurity of the second conductivity type in the fourth semiconductor region being higher than a concentration of the impurity of the second conductivity type in the second semiconductor region and not more than ½ of a concentration of the impurity of the second conductivity type in the third semiconductor region,
in the second state, the second to fourth semiconductor regions including an impurity of the first conductivity type and an impurity of the second conductivity type, a first difference between a concentration of the impurity of the second conductivity type in the fourth semiconductor region and a concentration of the impurity of the first conductivity type in the fourth semiconductor region being larger than a difference between a concentration of the impurity of the second conductivity type in the second semiconductor region and a concentration of the impurity of the first conductivity type in the second semiconductor region, the first difference being not more than ½ of a difference between a concentration of the impurity of the second conductivity type in the third semiconductor region and a concentration of the impurity of the first conductivity type in the third semiconductor region.

2. The semiconductor device according to claim 1, wherein
the first conductive region and the second conductive region include a metallic element,
a region including a boundary between the fourth semiconductor region and the second conductive region includes a bond between silicon and the metallic element, and
a region including a boundary between the first partial region and the first conductive region does not include the bond, or a concentration of the bond in the region including the boundary between the first partial region and the first conductive region is lower than a concentration of the bond in the region including the boundary between the fourth semiconductor region and the second conductive region.

3. The semiconductor device according to claim 1, wherein
the first conductive region includes a first metallic element,
the second conductive region includes a second metallic element, and
a work function of the first metallic element is lower than a work function of the second metallic element.

4. The semiconductor device according to claim 1, wherein
the first conductive region includes at least one selected from the group consisting of Ti, Mo, W, Pt, Ni, and Al, and
the second conductive region includes at least one selected from the group consisting of Ni, Ti, and Al.

5. The semiconductor device according to claim 1, wherein
the first partial region and the first conductive region have a Schottky contact, and
the fourth semiconductor region and the second conductive region have an ohmic contact.

6. The semiconductor device according to claim 5, wherein a contact resistance between the fourth semiconductor region and the second conductive region is not less than $1 \times 10^{-3}$ $\Omega cm^2$ and not more than $5 \times 10^{-3}$ $\Omega cm^2$.

7. The semiconductor device according to claim 1, wherein
a carrier concentration of the second conductivity type in the second semiconductor region is not less than $5 \times 10^{17}$ $cm^{-3}$ but less than $5 \times 10^{18}$ $cm^{-3}$,
a carrier concentration of the second conductivity type in the third semiconductor region is not less than $5 \times 10^{19}$ $cm^{-3}$ and not more than $1 \times 10^{21}$ $cm^{-3}$, and
a carrier concentration of the second conductivity type in the fourth semiconductor region is not less than $5 \times 10^{18}$ $cm^{-3}$ and not more than $5 \times 10^{20}$ $cm^{-3}$.

8. The semiconductor device according to claim 1, wherein
a length along the first direction of the second partial region is not less than 300 nanometers and not more than 2000 nanometers,
a length along the first direction of the third semiconductor region is not less than 50 nanometers and not more than 1000 nanometers, and
a length along the first direction of the fourth semiconductor region is not less than 20 nanometers and not more than 500 nanometers.

9. The semiconductor device according to claim 1, further comprising:
a second element;
a first connection member; and
a second connection member,
the second element including
a third electrode,
a fourth electrode, a direction from the third electrode toward the fourth electrode being aligned with a third direction, the fourth electrode including a third conductive region and a fourth conductive region, a fourth direction from the fourth conductive region toward the third conductive region crossing the third direction,
a fifth semiconductor region including silicon carbide of the first conductivity type and being provided between the third electrode and the third conductive region and between the third electrode and the fourth conductive region, a sixth semiconductor region including silicon carbide of the second conductivity type, the sixth semiconductor region including a third partial region and a fourth partial region, the third partial region being provided between the third electrode and the third conductive region, the fourth partial region being provided between the third electrode and the fourth conductive region, a seventh semiconductor region including silicon carbide of the second conductivity type and being provided between the fourth partial region and the fourth conductive region, and an eighth semiconductor region including silicon carbide of the second conductivity type and being provided between the seventh semiconductor region and the fourth conductive region, the second element having a third state or a fourth state, in the third state, the sixth to eighth semiconductor regions not including an impurity of the first conductivity type, a concentration of an impurity of the second conductivity type in the eighth semiconductor region being higher than a concentration of the impurity of the second conductivity type in the sixth semiconductor region and not more than ½ of a concentration of the impurity of the second conductivity type in the seventh semiconductor region, in the fourth state, the sixth to eighth semiconductor regions including an impurity of the first conductivity type and an impurity of the second conductivity type, a second difference between a concentration of the impurity of the second conductivity type in the eighth semiconductor region and a concentration of the impurity of the first conductivity type in the eighth semiconductor region being larger than a difference between a concentration of the impurity of the second conductivity type in the sixth semiconductor region and a concentration of the impurity of the first conductivity type in the sixth semiconductor region, the second difference being not more than ½ of a difference between a concentration of the impurity of the second conductivity type in the seventh semiconductor region and a concentration of the impurity of the first conductivity type in the seventh semiconductor region, the first connection member electrically connecting the first electrode and the third electrode to each other, the second connection member electrically connecting the second electrode and the fourth electrode to each other.

10. The semiconductor device according to claim 9, wherein the second element further includes a second semiconductor portion of the first conductivity type, the second semiconductor portion is provided between the third electrode and the fifth semiconductor region, and a concentration of an impurity of the first conductivity type in the second semiconductor portion is higher than a concentration of the impurity of the first conductivity type in the fifth semiconductor region.

11. The semiconductor device according to claim 1, wherein the first element further includes a first semiconductor portion of the first conductivity type, the first semiconductor portion is provided between the first electrode and the first semiconductor region, and a concentration of an impurity of the first conductivity type in the first semiconductor portion is higher than a concentration of the impurity of the first conductivity type in the first semiconductor region.

12. A semiconductor device, comprising a first element including a first electrode, a second electrode, a direction from the first electrode toward the second electrode being aligned with a first direction, the second electrode including a first conductive region and a second conductive region, a second direction from the second conductive region toward the first conductive region crossing the first direction, a first semiconductor region including silicon carbide of a first conductivity type and being provided between the first electrode and the first conductive region and between the first electrode and the second conductive region, a second semiconductor region including silicon carbide of a second conductivity type, the second semiconductor region including a first partial region and a second partial region, the first partial region being provided between the first electrode and the first conductive region, the second partial region being provided between the first electrode and the second conductive region, a third semiconductor region including silicon carbide of the second conductivity type and being provided between the second partial region and the second conductive region, and a fourth semiconductor region including silicon carbide of the second conductivity type and being provided between the third semiconductor region and the second conductive region, the fourth semiconductor region including at least one first element selected from the group consisting of Ar, Kr, Xe, Rn, N, P, Ti, and V, the first partial region not including the first element, or a concentration of the first element in the first partial region being lower than a concentration of the first element in the fourth semiconductor region.

13. The semiconductor device according to claim 12, wherein the concentration of the first element in the fourth semiconductor region is not less than $1\times10^{15}$ cm$^{-3}$ and not more than $1\times10^{19}$ cm$^{-3}$.

14. The semiconductor device according to claim 12, wherein the first partial region and the first conductive region have a Schottky contact.

15. A semiconductor device, comprising a first element including a first electrode, a second electrode, a direction from the first electrode toward the second electrode being aligned with a first direction, the second electrode including a first conductive region and a second conductive region, a second direction from the second conductive region toward the first conductive region crossing the first direction, a first semiconductor region including silicon carbide of a first conductivity type and being provided between the first electrode and the first conductive region and between the first electrode and the second conductive region, a second semiconductor region including silicon carbide of a second conductivity type, the second semiconductor region including a first partial region and a second partial region, the first partial region being provided between the first electrode and the first conductive region, the second partial region being provided between the first electrode and the second conductive region, a third semiconductor region including silicon carbide of the second conductivity type and being provided between the second partial region and the second conductive region, and a fourth semiconductor region including silicon carbide of the second conductivity type and being provided between the third semiconductor region and the second conductive region, a concentration of an impurity of the second conductivity type in the fourth semiconductor region being higher than a concentration of the impurity of the second conductivity type in the second semiconductor region and lower than a concentration of the impurity of the second conductivity type in the third semiconductor region, or the fourth semiconductor region including at least one first element selected from the group consisting of Ar, Kr, Xe, Rn, N, P, Ti, and V, a first forward voltage at a first temperature for a first current density being not less than a second forward voltage at a second temperature for the first current density, the first current density being within a range of use, the second temperature being higher than the first temperature, a third forward voltage at the first temperature for a second current density being not more than a fourth forward voltage at the second temperature for the second current density, the second current density being within the range of use and higher than the first current density.

16. The semiconductor device according to claim 1, wherein a ratio of an intensity at 500 nanometers for a photoluminescence of the fourth semiconductor region to an intensity at 380 nanometers for the photoluminescence of the fourth semiconductor region is higher than a ratio of an intensity at 500 nanometers for a photoluminescence of the first partial region to an intensity at 380 nanometers for the photoluminescence of the first partial region.

17. The semiconductor device according to claim 1, wherein
a direction from the third semiconductor region toward a portion of the first partial region is aligned with the second direction, and
a direction from the fourth semiconductor region toward another portion of the first partial region is aligned with the second direction.

18. The semiconductor device according to claim 17, wherein
a length along the second direction of the third semiconductor region is shorter than a length along the second direction of the first partial region, and
a length along the second direction of the fourth semiconductor region is shorter than the length along the second direction of the first partial region.

19. The semiconductor device according to claim 18, wherein
the length along the second direction of the third semiconductor region is not less than 0.2 times and not more than 0.95 times the length along the second direction of the first partial region, and
the length along the second direction of the fourth semiconductor region is not less than 0.2 times and not more than 0.95 times the length along the second direction of the first partial region.

20. The semiconductor device according to claim 1, wherein the semiconductor device is a diode.

* * * * *